United States Patent
Kuo

(10) Patent No.: US 11,152,540 B2
(45) Date of Patent: Oct. 19, 2021

(54) LIGHT EMITTING DIODE STRUCTURE AND METHOD OF MANUFACTURING THEREOF

(71) Applicant: Lextar Electronics Corporation, Hsinchu (TW)

(72) Inventor: Shiou-Yi Kuo, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 16/524,202

(22) Filed: Jul. 29, 2019

(65) Prior Publication Data
US 2021/0036188 A1    Feb. 4, 2021

(51) Int. Cl.
| | |
|---|---|
| *H01L 33/22* | (2010.01) |
| *H01L 33/62* | (2010.01) |
| *H01L 33/44* | (2010.01) |
| *H01L 33/38* | (2010.01) |
| *H01L 33/00* | (2010.01) |

(52) U.S. Cl.
CPC .......... *H01L 33/22* (2013.01); *H01L 33/0093* (2020.05); *H01L 33/38* (2013.01); *H01L 33/44* (2013.01); *H01L 2933/0016* (2013.01); *H01L 2933/0025* (2013.01)

(58) Field of Classification Search
CPC . H01L 33/0079; H01L 33/0093; H01L 33/22; H01L 33/38; H01L 33/42; H01L 33/44; H01L 33/52; H01L 33/62
USPC .......................................................... 257/98
See application file for complete search history.

(56) References Cited

U.S. PATENT DOCUMENTS

| | | |
|---|---|---|
| 5,286,335 A | 2/1994 | Drabik et al. |
| 6,613,610 B2 | 9/2003 | Iwafuchi et al. |
| 6,614,058 B2 | 9/2003 | Lin et al. |
| 9,640,715 B2 | 5/2017 | Bower et al. |
| 10,262,966 B2 | 4/2019 | Bower |
| 10,381,332 B2 | 8/2019 | Ulmer et al. |
| 10,504,878 B2 | 12/2019 | Min et al. |
| 10,811,567 B2 | 10/2020 | Lim et al. |
| 2008/0142813 A1 | 6/2008 | Chang et al. |
| 2011/0089452 A1 | 4/2011 | Jeong et al. |
| 2011/0210354 A1 | 9/2011 | Ichikawa et al. |
| 2011/0241065 A1 | 10/2011 | Jeong |

(Continued)

FOREIGN PATENT DOCUMENTS

| | | |
|---|---|---|
| CN | 101740687 A | 6/2010 |
| CN | 102222757 A | 10/2011 |

(Continued)

*Primary Examiner* — Fazli Erdem
(74) *Attorney, Agent, or Firm* — CKC & Partners Co., LLC

(57) ABSTRACT

A light emitting diode structure includes a semiconductor stack and a supporting breakpoint. The semiconductor stack includes a first semiconductor layer, a light emitting layer, and a second semiconductor layer. The first semiconductor layer has a light emitting surface exposed outside and the light emitting surface has a rough texture. The light emitting layer is disposed on the first semiconductor layer. The second semiconductor layer is disposed on the light emitting layer, and the second semiconductor layer has a type that is different from the first semiconductor layer. The supporting breakpoint is on the light emitting surface. The light emitting diode structure can be applied in wide color gamut (WCG) backlight module or ultra-thin backlight module.

20 Claims, 15 Drawing Sheets

(56) References Cited

U.S. PATENT DOCUMENTS

| | | | |
|---|---|---|---|
| 2013/0119424 A1 | 5/2013 | Kang et al. | |
| 2014/0084240 A1* | 3/2014 | Hu | H01L 33/0093 |
| | | | 257/13 |
| 2015/0115290 A1 | 4/2015 | Guenard | |
| 2016/0254253 A1* | 9/2016 | Meitl | H01L 33/505 |
| | | | 257/88 |
| 2016/0300745 A1 | 10/2016 | Chang et al. | |
| 2018/0204973 A1 | 7/2018 | Jeung et al. | |
| 2018/0226287 A1* | 8/2018 | Bower | B65G 47/91 |
| 2018/0277524 A1* | 9/2018 | Moon | H01L 33/22 |
| 2019/0327827 A1 | 10/2019 | Chang et al. | |
| 2019/0355884 A1 | 11/2019 | Pan et al. | |
| 2019/0386176 A1* | 12/2019 | Wu | H01L 33/20 |

FOREIGN PATENT DOCUMENTS

| | | |
|---|---|---|
| CN | 104979338 A | 10/2015 |
| CN | 205944139 U | 2/2017 |
| CN | 106816408 A | 6/2017 |
| CN | 107438899 A | 12/2017 |
| CN | 107507845 A | 12/2017 |
| CN | 107681034 A | 2/2018 |
| CN | 108417682 A | 8/2018 |
| CN | 108666338 A | 10/2018 |
| CN | 109004078 A | 12/2018 |
| CN | 109494287 A | 3/2019 |
| CN | 109844948 A | 6/2019 |
| JP | 6-45650 A | 2/1994 |
| TW | I667643 B | 8/2019 |

* cited by examiner

LIGHT EMITTING DIODE STRUCTURE AND METHOD OF MANUFACTURING THEREOF

BACKGROUND

Field of Invention

The present invention relates to a light emitting diode structure and method of manufacturing thereof.

Description of Related Art

As comparing to the conventional light emitting diode, the size of the micro light emitting diode (micro LED) is reduced to a level of micron meters (μm), and the target yield of manufacturing the micro LEDs is aimed to be over 99%. However, conventional processes of fabricating micro LEDs face various technical challenges, in which the mass transfer technology is the most crucial process. Furthermore, many other technical problems need to be resolved, for example the precision of the equipment, the transfer yields, the transfer time, the rework property, and the processing cost.

For example, the current technology for manufacturing a micro light emitting diode is to first define a micro light emitting diode structure by processes, and then the micro light emitting diode structure is bonded to a first temporary substrate and the sapphire substrate is removed by laser lift-off (LLO) technology. The micro light emitting diode structure is then bonded to a second temporary substrate by using a bonding material. Next, after removing the first temporary substrate and manufacturing a supporter structure, the bonding material is etched, and the epitaxial structure in the micro light emitting diode structure is finally transferred. In the processes above, it requires two times of bonding the temporary substrate and two times of removing the temporary substrate. In addition to the poor control of the yield loss, after the stress of the epitaxial structure is released, the spacing pitch between the micro light emitting diodes is also different from the original design, thereby causing the alignment problem during the transfer.

SUMMARY

In accordance with an aspect of the present disclosure, a light emitting diode structure is provided. The light emitting diode structure includes a semiconductor stack and a supporting breakpoint. The semiconductor stack includes a first semiconductor layer, a light emitting layer, and a second semiconductor layer. The first semiconductor layer has a light emitting surface exposed outside and the light emitting surface has a rough texture. The light emitting layer is disposed on the first semiconductor layer. The second semiconductor layer is disposed on the light emitting layer, and the second semiconductor layer has a type that is different from the first semiconductor layer. The supporting breakpoint is on the light emitting surface.

According to some embodiments of the present disclosure, the first semiconductor layer includes a first portion and a second portion, the second portion is disposed on the first portion, and a width of the first portion is greater than a width of the second portion.

According to some embodiments of the present disclosure, the first semiconductor layer includes a doped semiconductor layer and an undoped semiconductor layer, the doped semiconductor layer is between the light emitting layer and the undoped semiconductor layer, and the light emitting surface is on the undoped semiconductor layer.

According to some embodiments of the present disclosure, the light emitting diode structure further includes an insulation layer covering a sidewall of the semiconductor stack.

According to some embodiments of the present disclosure, the light emitting diode structure further includes a first conductive pad and a second conductive pad. The first conductive pad is electrically connected to the first semiconductor layer. The second conductive pad is electrically connected to the second semiconductor layer.

Another aspect of the present disclosure provides a light emitting diode structure. The light emitting diode structure includes a semiconductor stack and a supporter. The semiconductor stack includes a first semiconductor layer, a light emitting layer, and a second semiconductor layer stacked in sequence, wherein the first semiconductor layer has a light emitting surface exposed outside and the light emitting surface has a rough texture. The supporter in contact with the light emitting surface.

According to some embodiments of the present disclosure, the supporter can be broken off.

According to some embodiments of the present disclosure, the second semiconductor layer has a type that is different from the first semiconductor layer.

According to some embodiments of the present disclosure, the first semiconductor layer includes a first portion and a second portion, the second portion is disposed on the first portion, and a width of the first portion is greater than a width of the second portion.

According to some embodiments of the present disclosure, the first semiconductor layer includes a doped semiconductor layer and an undoped semiconductor layer, the doped semiconductor layer is between the light emitting layer and the undoped semiconductor layer, and the light emitting surface is on the undoped semiconductor layer.

According to some embodiments of the present disclosure, the light emitting diode structure further includes an insulation layer covering at least a sidewall of the semiconductor stack, wherein the insulation layer has a first opening and a second opening respectively located on the first semiconductor layer and the second semiconductor layer.

According to some embodiments of the present disclosure, the light emitting diode structure further includes a first conductive pad and a second conductive pad. The first conductive pad is electrically connected to the first semiconductor layer through the first opening. The second conductive pad is electrically connected to the second semiconductor layer through the second opening.

Another aspect of the present disclosure provides a method of manufacturing a light emitting diode structure. The method includes following operations. A precursor structure is formed. The precursor structure includes a carrier substrate, a supporting layer, a sacrificial layer and an epitaxial stack. The supporting layer is disposed on the carrier substrate, wherein the supporting layer has a base portion and a supporter protruded from the base portion. The sacrificial layer is disposed on the base portion of the supporting layer, wherein the sacrificial layer has a height that is substantially equal to a height of the supporter. The epitaxial stack is on the sacrificial layer, wherein the epitaxial stack has a light emitting surface in contact with the supporter and the sacrificial layer, and the light emitting surface has a rough texture. A portion of the epitaxial stack is then removed to form a semiconductor stack and exposing a portion of the sacrificial layer. At least a portion of the sacrificial layer in contact with the supporter is then removed such that the semiconductor stack is supported by the supporter and separated from the sacrificial layer. The supporter of the supporting layer is then broken to form a light emitting diode structure.

According to some embodiments of the present disclosure, forming the precursor structure includes: forming the epitaxial stack on a growth substrate, wherein the light emitting surface is exposed outside; forming the sacrificial layer on the epitaxial stack, wherein the sacrificial layer has a gap exposing a portion of the light emitting surface; forming the supporting layer on the sacrificial layer, wherein the supporter is filled in the gap and in contact with the epitaxial stack; forming the carrier substrate over the sacrificial layer; and removing the growth substrate.

According to some embodiments of the present disclosure, forming the precursor structure includes: forming the epitaxial stack on a growth substrate, wherein the light emitting surface is in contact with the growth substrate; forming a temporary substrate on the epitaxial stack; removing the growth substrate to expose the light emitting surface; forming the sacrificial layer on the light emitting surface of the epitaxial stack, wherein the sacrificial layer has a gap exposing a portion of the light emitting surface; forming the supporting layer on the sacrificial layer, wherein the supporter is filled in the gap and in contact with the epitaxial stack; forming the carrier substrate over the sacrificial layer; and removing the temporary substrate to expose the epitaxial stack.

According to some embodiments of the present disclosure, the precursor structure further includes an adhesive layer between the supporting layer and the carrier substrate.

According to some embodiments of the present disclosure, the semiconductor stack includes a first semiconductor layer, a light emitting layer, and a second semiconductor layer. The first semiconductor layer is in contact with the supporter, wherein the first semiconductor layer has a first portion and a second portion, the second portion is disposed on the first portion, and a width of the first portion is greater than a width of the second portion. The light emitting layer is disposed on the first semiconductor layer. The second semiconductor layer is disposed on the light emitting layer, wherein the second semiconductor layer has a type that is different from the first semiconductor layer.

According to some embodiments of the present disclosure, the first semiconductor layer includes a doped semiconductor layer and an undoped semiconductor layer, the doped semiconductor layer is between the light emitting layer and the undoped semiconductor layer, and the light emitting surface is on the undoped semiconductor layer.

According to some embodiments of the present disclosure, the method further includes forming an insulation layer covering at least a sidewall of the semiconductor stack, wherein the insulation layer has a first opening and a second opening respectively exposed a portion of the first semiconductor layer and a portion of the second semiconductor layer.

According to some embodiments of the present disclosure, the method further includes forming a first conductive pad and a second conductive pad respectively in the first opening and the second opening.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

The present disclosure is described by the following specific embodiments. Those with ordinary skill in the arts can readily understand the other advantages and functions of the present disclosure after reading the disclosure of this specification. The present disclosure can also be implemented with different embodiments. Various details described in this specification can be modified based on different viewpoints and applications without departing from the scope of the present disclosure.

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

Figure 1:
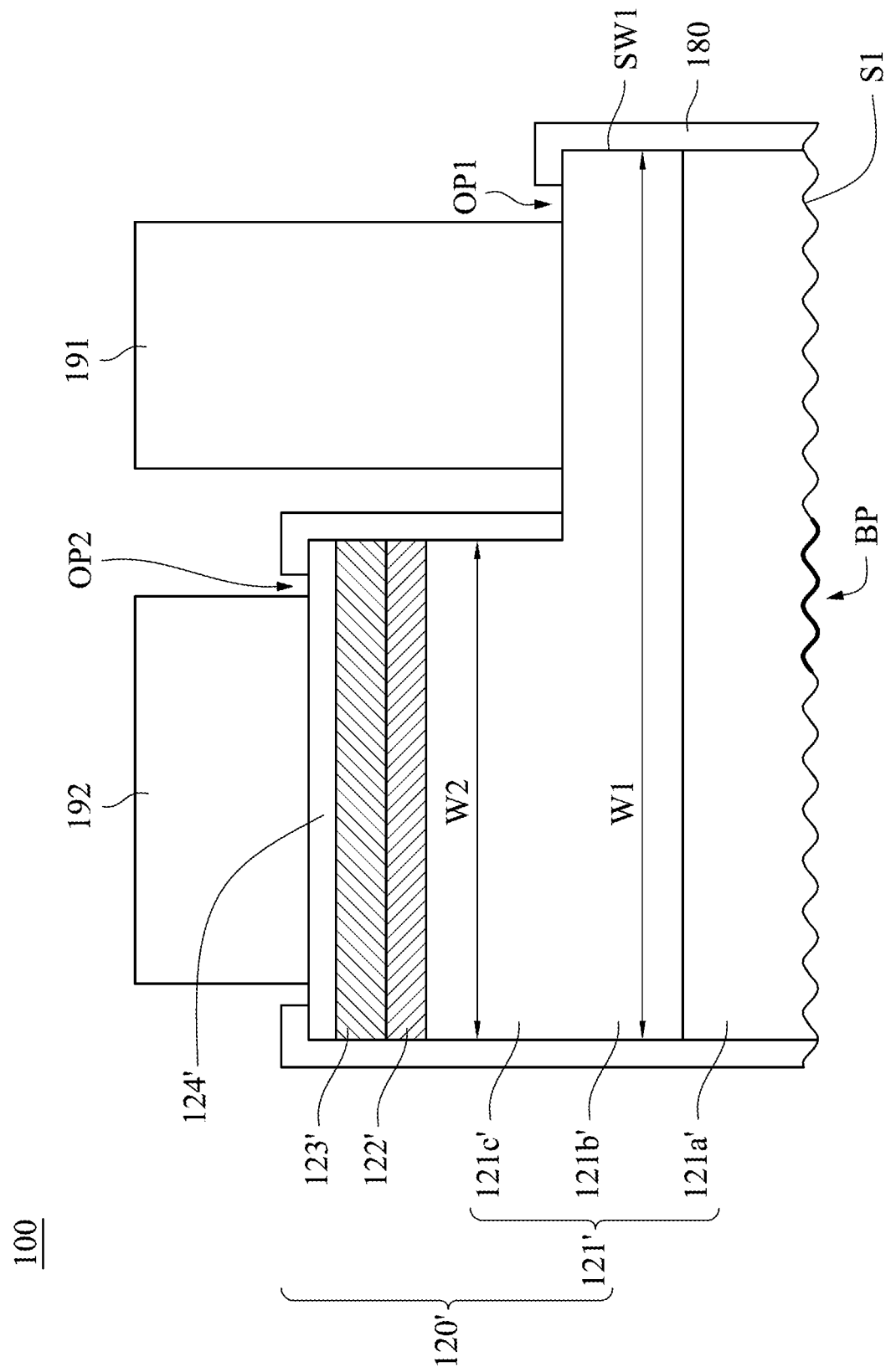
FIG. 1 is a cross-sectional view of a light emitting diode structure, in accordance with various embodiments of the present disclosure.

FIG. 1 is a cross-sectional view schematically illustrating a light emitting diode structure 100 in accordance with various embodiments of the present disclosure. Reference is made to FIG. 1, the light emitting diode structure 100 disclosed herein includes a semiconductor stack 120' and a supporting breakpoint BP. In some embodiments, the light emitting diode structure 100 may emit visible light. The light emitting diode structure 100 may optionally include other elements, which are described hereinafter.

As shown in FIG. 1, the semiconductor stack 120' includes a first semiconductor layer 121', a light emitting layer 122', and a second semiconductor layer 123'. The first semiconductor layer 121' has a light emitting surface S1 exposed outside and the light emitting surface S1 has a rough texture. Specifically, the light emitting diode structure 100 may emit a light passed through the light emitting surface S1. The supporting breakpoint BP is on the light emitting surface S1. In some embodiments, the first semiconductor layer 121' includes doped semiconductor layers 121b', 121c' and an undoped semiconductor layer 121a', and the light emitting surface S1 is on the undoped semiconductor layer 121a'. The doped semiconductor layers 121b', 121c' are between the light emitting layer 122' and the undoped semiconductor layer 121a'. In other embodiments, the undoped semiconductor layer 121a' can be omitted, and the light emitting surface S1 is on the doped semiconductor layer 121b'.

In some embodiments, the first semiconductor layer 121' includes a first portion (i.e., the undoped semiconductor layer 121*a*' and the doped semiconductor layer 121*b*') and a second portion (i.e., the doped semiconductor layer 121*c*') disposed on the first portion, and a width W1 of the first portion is greater than a width W2 of the second portion. In other embodiments, the undoped semiconductor layer 121*a*' can be omitted. That is, the first portion is the doped semiconductor layer 121*b*', and the second portion is the doped semiconductor layer 121*c*'. The doped semiconductor layer 121*b*' and 121*c*' are made of same material.

In some embodiments, the first semiconductor layer 121' may be III-V group semiconductor layer. For example, the III-V group semiconductor layer may include a binary epitaxial material such as GaAs, GaN, GaP, InAs, AlN, InN, and InP, or a ternary or quaternary epitaxial material such as AlGaN, AlGaAs, InGaP, InGaN, AlInGaN, AlInGaP, and InGaAsP. In some examples, the semiconductor layer 121*a*' may be an undoped III-V group semiconductor layer, and the semiconductor layer 121*b*', 121*c*' may be N-type III-V group semiconductor layer. The N-type III-V group semiconductor layer may be formed by doping a IVA group element (such as silicon) into the III-V group semiconductor layer mentioned above. In other examples, the semiconductor layer 121*a*' of the first semiconductor layer 121' is omitted, and the semiconductor layer 121*b*', 121*c*' may be P-type III-V group semiconductor layer. The P-type III-V group semiconductor layer may be formed by doping a IIA group element (such as beryllium, magnesium, calcium, or strontium) into the III-V group semiconductor layer mentioned above.

The light emitting layer 122' is disposed on the first semiconductor layer 121'. In some embodiments, the light emitting layer 122' may include a multiple quantum well (MQW), a single-quantum well (SQW), a homojunction, a heterojunction, or other similar structures, but is not limited thereto. In some embodiments, the light emitting layer 122' has a width that is substantially equal to the width W2 of the second portion of the first semiconductor layer 121'.

The second semiconductor layer 123' is disposed on the light emitting layer 122', and the second semiconductor layer 123' has a type that is different from the first semiconductor layer 121'. In some embodiments, the second semiconductor layer 123' may be a P-type III-V group semiconductor layer mentioned above. In other embodiments, the second semiconductor layer 123' may be an N-type III-V group semiconductor layer mentioned above. In some examples, the undoped semiconductor layer 121*a*' includes undoped GaN, the doped semiconductor layers 121*b*', 121*c*' include N-type GaN, and the second semiconductor layer 123' includes P-type GaN. In other examples, the semiconductor layer 121*a*' of the first semiconductor layer 121' is omitted, the semiconductor layer 121*b*', 121*c*' may be P-type GaP, and the second semiconductor layer 123' may be N-type AlInGaP. In some embodiments, the second semiconductor layer 123' has a width that is substantially equal to the width W2 of the second portion of the first semiconductor layer 121' and the width of the light emitting layer 122'.

In some embodiments, the light emitting diode structure 100 further includes an insulation layer 180 covering at least a sidewall SW1 of the semiconductor stack 120'. As shown in FIG. 1, the insulation layer 180 has a first opening OP1 and a second opening OP2 respectively located on the first semiconductor layer 121' and the second semiconductor layer 123'. In some embodiments, the light emitting diode structure 100 further includes a first conductive pad 191 and a second conductive pad 192. The first conductive pad 191 is electrically connected to the first semiconductor layer 121', and the second conductive pad 192 is electrically connected to the second semiconductor layer 123'. Specifically, the first conductive pad 191 is electrically connected to the first semiconductor layer 121' through the first opening OP1, and the second conductive pad 192 is electrically connected to the second semiconductor layer 123' through the second opening OP2. In some embodiments, the light emitting diode structure 100 further includes a conductive contact layer 124' between the second conductive pad 192 and the second semiconductor layer 123'. In other embodiments, the conductive contact layer 124' can be omitted.

Another aspect of the present disclosure is to provide a method for manufacturing a light emitting diode structure 100. FIG. 2 to FIG. 8 are cross-sectional views illustrating various process stages of manufacturing the light emitting diode structure 100 in accordance with one embodiment of the present disclosure.

Figure 5:
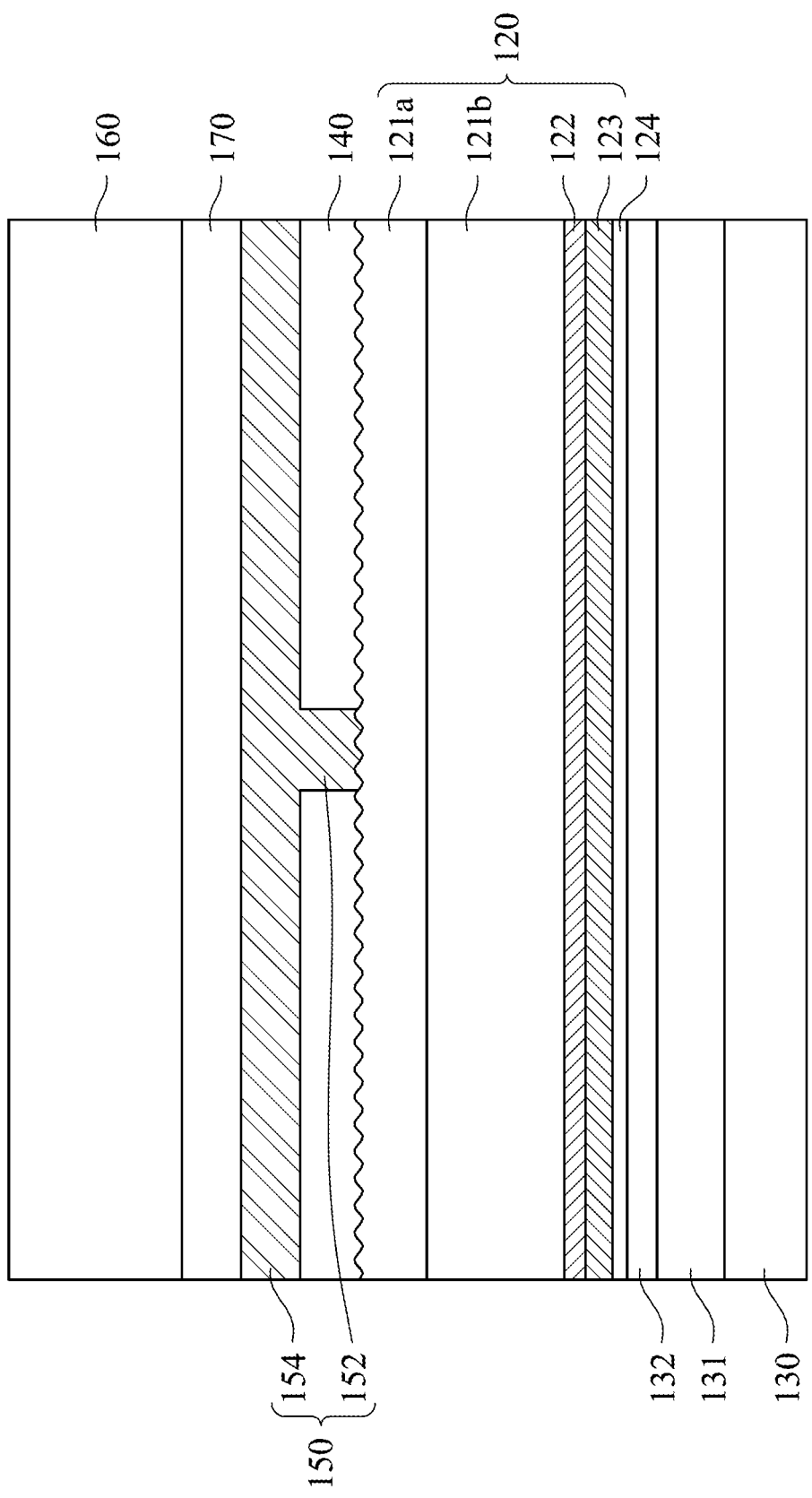
Figure 6:
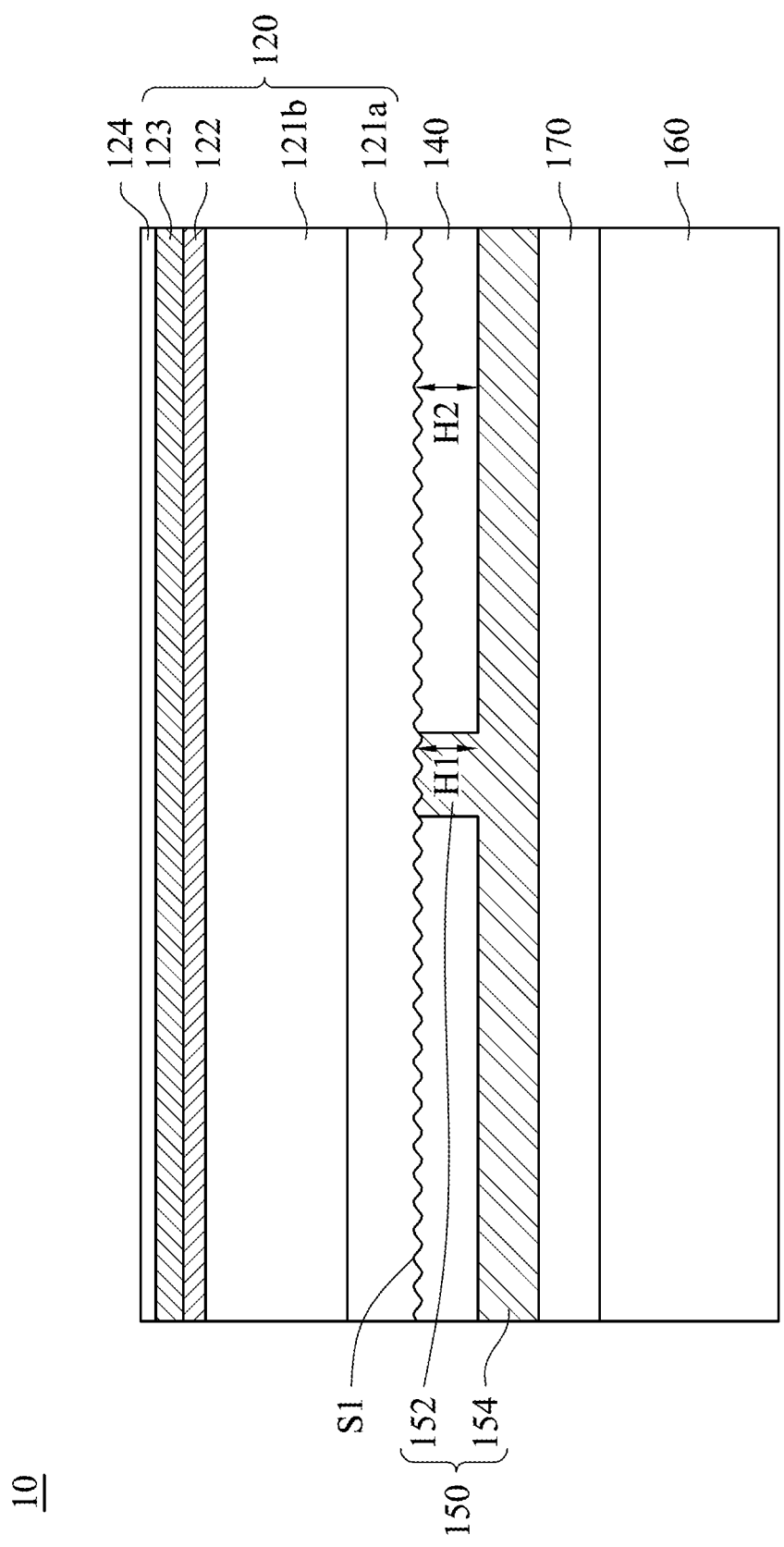

The method for manufacturing the light emitting diode structure 100 includes forming a precursor structure 10 (shown in FIG. 6). FIG. 2 to FIG. 6 are cross-sectional views illustrating various process stages of manufacturing the precursor structure 10 according to one embodiment of the present disclosure.

Figure 2:
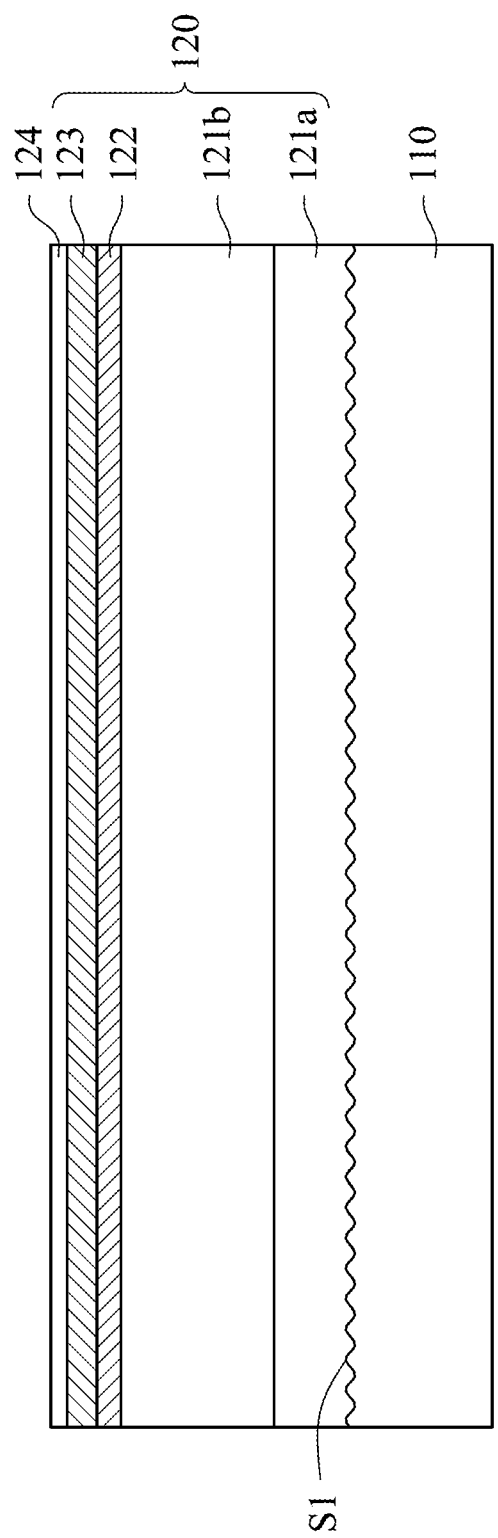
FIG. 2 to FIG. 8 are cross-sectional views illustrating various process stages of manufacturing a light emitting diode structure, in accordance with one embodiment of the present disclosure.

Please refer to FIG. 2, an epitaxial stack 120 is formed on a growth substrate 110, wherein the light emitting surface 51 is in contact with the growth substrate 110. The light emitting surface 51 has a rough texture. Specifically, the epitaxial stack 120 includes first semiconductor layers 121*a*, 121*b*, a light emitting layer 122, and a second semiconductor layer 123 stacked in sequence on the growth substrate 110. The material of the first semiconductor layers 121*a*, 121*b*, the light emitting layer 122, and the second semiconductor layer 123 may be respectively same as the first semiconductor layer 121', the light emitting layer 122', and the second semiconductor layer 123' described above, and will not be repeated hereinafter. In some embodiments, the growth substrate 110 may be a sapphire substrate or other suitable substrates.

In some embodiments, a conductive layer 124 is further formed on the second semiconductor layer 123. The conductive layer 124 may include any suitable conductive material such as metal oxide (i.e., indium tin oxide (ITO), IZO, AZO), metal (i.e., Ti, Ni, Al, Au, Pt, Cr, Ag, Cu), or metal alloy. In other embodiments, the conductive layer 124 can be omitted.

Figure 3:
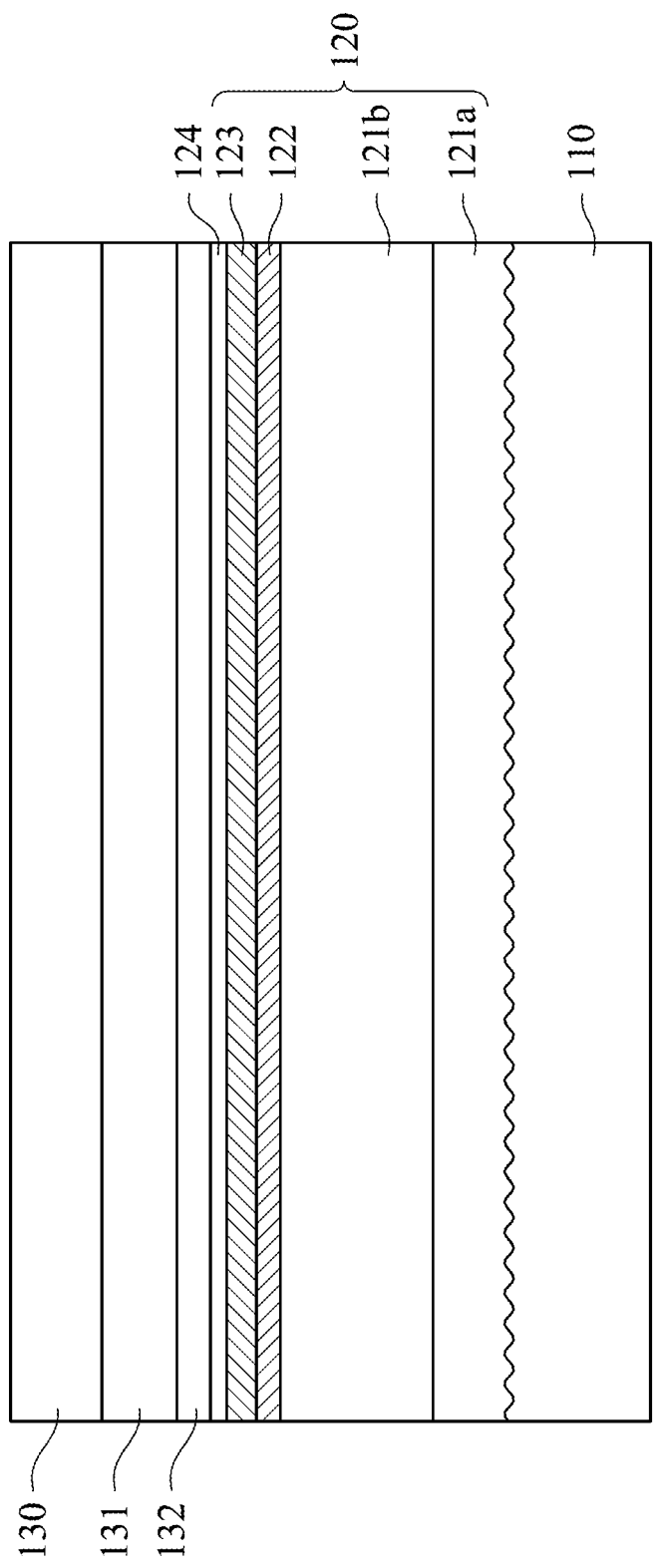

Reference is made to FIG. 3, a temporary substrate 130 is formed on the epitaxial stack 120. In some embodiments, the temporary substrate 130 may be a sapphire substrate or other suitable substrates. In some embodiments, a buffer layer 131 and a bonding layer 132 are further formed between the temporary substrate 130 and the epitaxial stack 120. In some examples, the buffer layer 131 may include undoped semiconductor same as the semiconductor layer 121*a*, but is not limited thereto. In some examples, the bonding layer 132 may be benzocyclobutene (BCB), but is not limited thereto.

Figure 4:
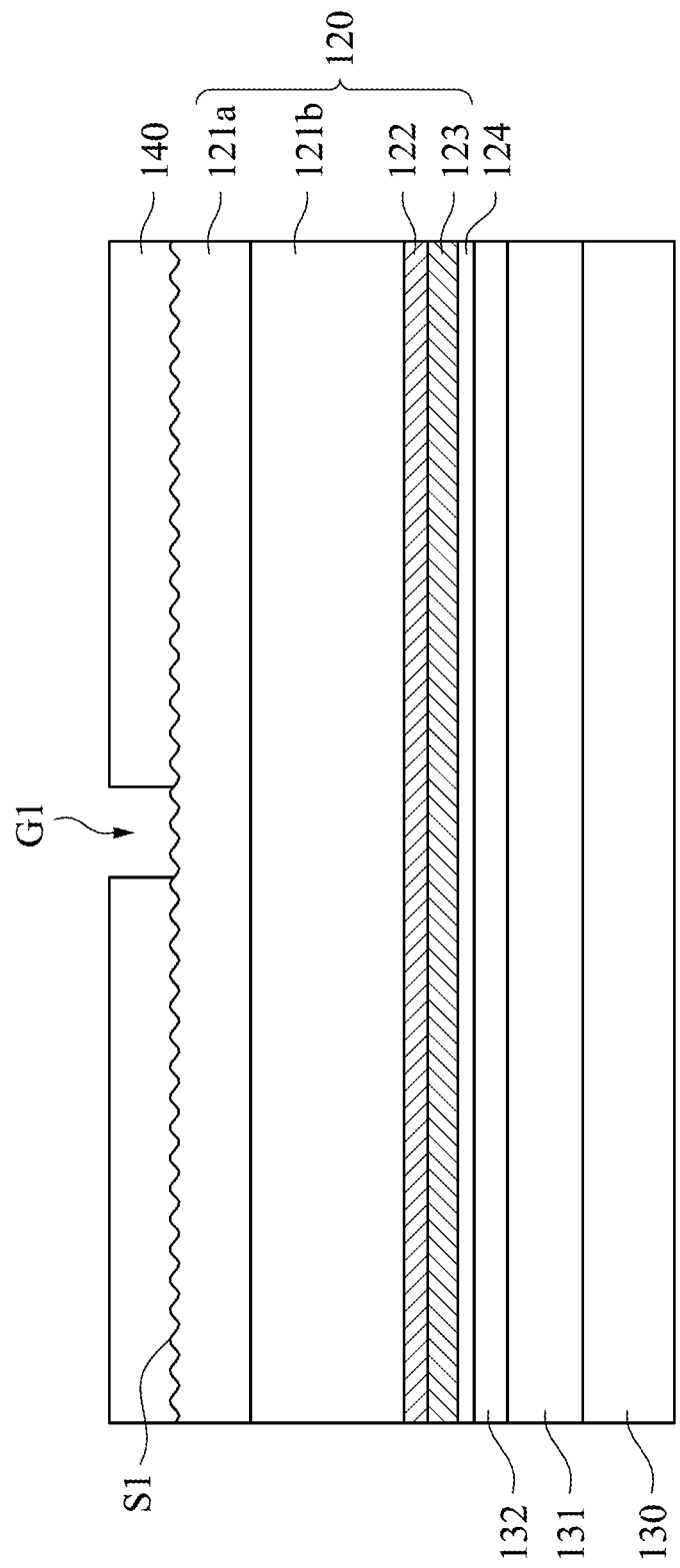

Please refer to FIG. 4, the growth substrate 110 is removed to expose the light emitting surface S1. It should be stated that after forming the temporary substrate 130 on the epitaxial stack 120, the structure shown in FIG. 3 is flipped upside down so that the growth substrate 110 is at the top and the temporary substrate 130 is at the bottom. In some embodiments, the growth substrate 110 may be removed by any suitable method such as laser lift-off (LLO), grinding, or etching. Next, a sacrificial layer 140 is formed on the light emitting surface S1 of the epitaxial stack 120. As shown in FIG. 4, the sacrificial layer 140 has a gap G1 exposing a portion of the light emitting surface S1. In some embodiments, the gap G1 has a width of about 0.5-10 μm. For example, the width of the gap G1 may be 0.6, 0.7, 0.8, 1, 2, 5, 8, or 9 μm. In some embodiments, the sacrificial layer 140 may include benzocyclobutene (BCB) or polyimide (PI), but is not limited thereto. In some embodiments, the undoped semiconductor layer 121a is further removed before forming sacrificial layer 140, such that the sacrificial layer 140 is formed on the first semiconductor layer 121b having a rough light emitting surface.

Referring to FIG. 5, a supporting layer 150 is formed on the sacrificial layer 140. The supporting layer 150 may include a base portion 154 and a supporter 152 protruded from the base portion 154. Specifically, the supporter 152 is filled in the gap G1 and is in contact with the light emitting surface 51 of the epitaxial stack 120. In some embodiments, the supporter 152 may be a cylinder or a polygon column. In some examples, supporter 152 has a width or a diameter of about 0.5-10 μm, for example, may be about 0.6, 0.7, 0.8, 1, 2, 5, 8, or 9 μm. In some embodiments, the supporting layer 150 may include insulating materials, metallic materials, or other supporting materials. For example, the insulating materials include silicon dioxide, silicon nitride, silicon oxynitride, and epoxy resin; and the metallic materials include aluminum, titanium, platinum, or nickel, but not limited thereto.

Still referring to FIG. 5, a carrier substrate 160 is formed over the sacrificial layer 140. In some embodiments, the carrier substrate 160 may be a sapphire substrate or other suitable substrates. In some embodiments, an adhesive layer 170 may be formed between the supporting layer 150 and the carrier substrate 160. The carrier substrate 160 can be adhered to the supporting layer 150 by the adhesive layer 170 to enhance the adhesion between the carrier substrate 160 and the supporting layer 150. In some embodiments, the adhesive layer 170 may include insulation glue, conductive glue and/or metals. In some examples, the materials of the adhesive layer 170 may be insulation glue such as an epoxy resin or a silicone, but not limited thereto. In some examples, the materials of the adhesive layer 170 may be conductive glue such as an epoxy resin mixed with silver powders, but not limited thereto. In some examples, the materials of the adhesive layer 170 may be a metal such as copper, aluminum, tin and/or zinc, but not limited thereto.

Referring to FIG. 6, the temporary substrate 130, the buffer layer 131 and the bonding layer 132 are removed. In some embodiments, the conductive layer 124 is omitted, and the epitaxial stack 120 is exposed after removing the temporary substrate 130. It should be stated that after forming the carrier substrate 160 on the supporting layer 150, the structure shown in FIG. 5 is flipped upside down so that the temporary substrate 130 is at the top and the carrier substrate 160 is at the bottom to remove the temporary substrate 130. In some embodiments, the temporary substrate 130 may be removed by any suitable method such as laser lift-off (LLO), grinding, or etching.

As shown in FIG. 6, the precursor structure 10 is formed. The precursor structure 10 includes the carrier substrate 160, the supporting layer 150, the sacrificial layer 140, and the epitaxial stack 120. The supporting layer 150 is disposed on the carrier substrate 160, and includes the base portion 154 and the supporter 152 protruded from the base portion 154. The sacrificial layer 140 is disposed on the base portion 154 of the supporting layer 150. The sacrificial layer 140 has a height H2 that is substantially equal to a height H1 of the supporter 152. The epitaxial stack 120 is on the sacrificial layer 140 and the supporting layer 150. The epitaxial stack 120 has a light emitting surface S1 in contact with the supporter 152 and the sacrificial layer 140, and the light emitting surface S1 has a rough texture. The adhesive layer 170 may be disposed between the supporting layer 150 and the carrier substrate 160.

Figure 7:
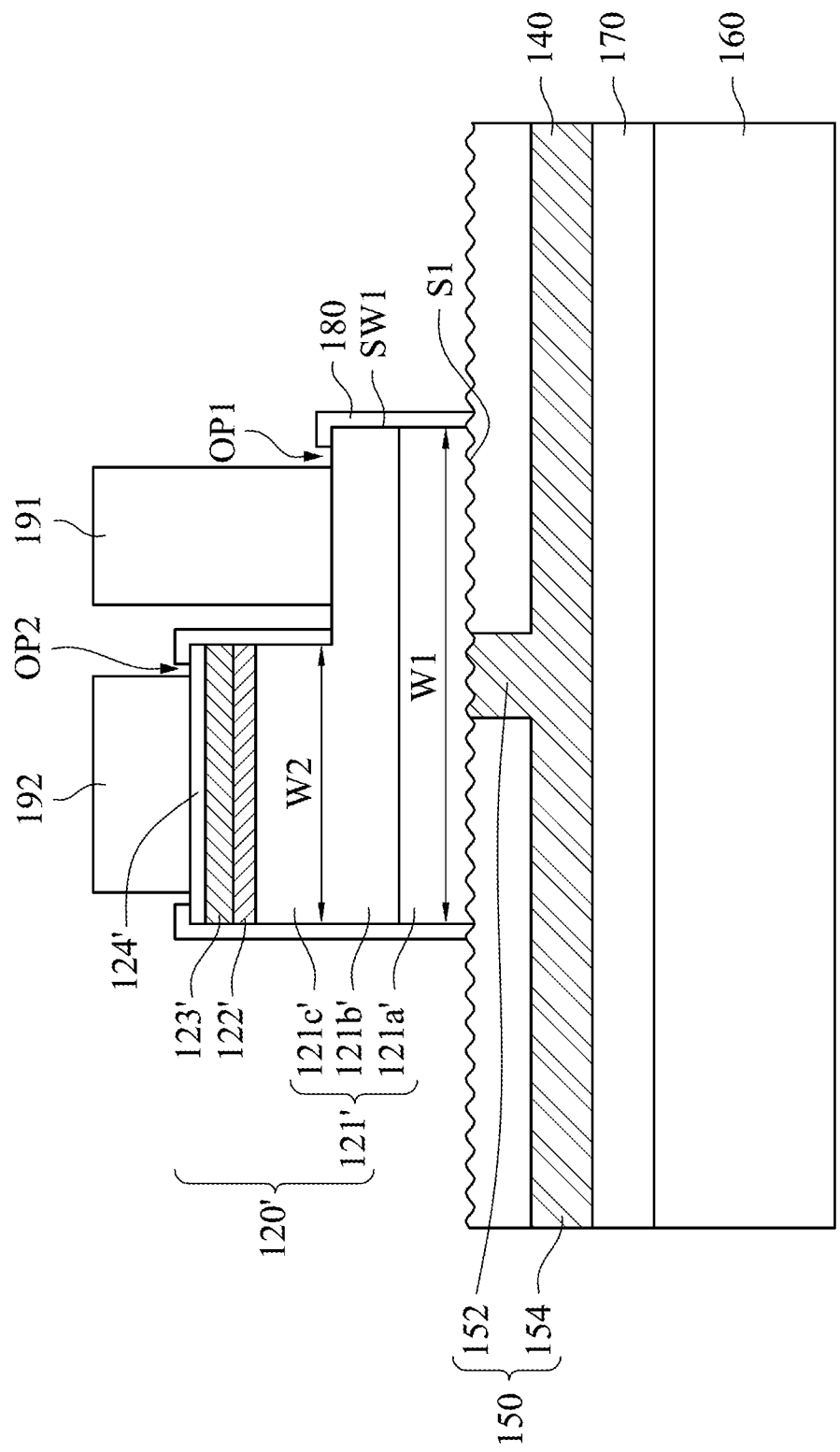

Reference is made to FIG. 7, after the precursor structure 10 is formed, the method continues to remove a portion of the epitaxial stack 120 to form a semiconductor stack 120' and exposing a portion of the sacrificial layer 140. As shown in FIG. 7, the semiconductor stack 120' includes a first semiconductor layer 121', a light emitting layer 122', and a second semiconductor layer 123'. The first semiconductor layer 121' is in contact with the supporter 152. In some embodiments, the first semiconductor layer 121' includes a first portion (i.e., the undoped semiconductor layer 121a' and the doped semiconductor layer 121b') and a second portion (i.e., the doped semiconductor layer 121c') disposed on the first portion, and a width W1 of the first portion is greater than a width W2 of the second portion. In other embodiments, the undoped semiconductor layer 121a' is omitted. That is, the first portion is doped semiconductor layer 121b', and the second portion is the doped semiconductor layer 121c'.

In some embodiments, the first semiconductor layer 121' includes doped semiconductor layers 121b', 121c' and an undoped semiconductor layer 121a', and the light emitting surface S1 is on the undoped semiconductor layer 121a'. The doped semiconductor layers 121b', 121c' are between the light emitting layer 122' and the undoped semiconductor layer 121a'. In other embodiments, the undoped semiconductor layer 121a' can be omitted, and the light emitting surface S1 is on the doped semiconductor layer 121b'.

The light emitting layer 122' is disposed on the first semiconductor layer 121'. The second semiconductor layer 123' is disposed on the light emitting layer 122', wherein the second semiconductor layer 123' has a type that is different from the first semiconductor layer 121'. In some examples, the undoped semiconductor layer 121a' may be undoped GaN, the doped semiconductor layers 121b', 121c' may be N-type GaN and the second semiconductor layer 123' may be P-type GaN.

As shown in FIG. 7, in some embodiments, a portion of the conductive layer 124 is further removed during removing a portion of the epitaxial stack 120 to formed an conductive contact layer 124' on the semiconductor stack 120'. In other embodiments, the conductive contact layer 124' can be omitted.

After the formation of the semiconductor stack 120', the method may further include forming an insulation layer 180 covering at least a sidewall SW1 of the semiconductor stack 120'. The insulation layer 180 has a first opening OP1 and a second opening OP2 respectively exposed a portion of the first semiconductor layer 121' and a portion of the second semiconductor layer 123' (or the conductive contact layer 124'). In some embodiments, the insulation layer 180 may be formed by chemical vapor deposition, printing, coating, or other suitable methods.

Next, the method may further include forming a first conductive pad 191 and a second conductive pad 192 respectively in the first opening OP1 and the second opening OP2. Specifically, the first conductive pad 191 is electrically connected to the first semiconductor layer 121' through the first opening OP1, and the second conductive pad 192 is electrically connected to the second semiconductor layer 123' through the second opening OP2. In some embodiments, the first conductive pad 191 and the second conductive pad 192 can be formed by sputtering, evaporation, or electroplating. In some embodiments, the first conductive pad 191 and the second conductive pad 192 may include aluminum, copper, nickel, gold, platinum, titanium, or other suitable conductive materials.

Figure 8:
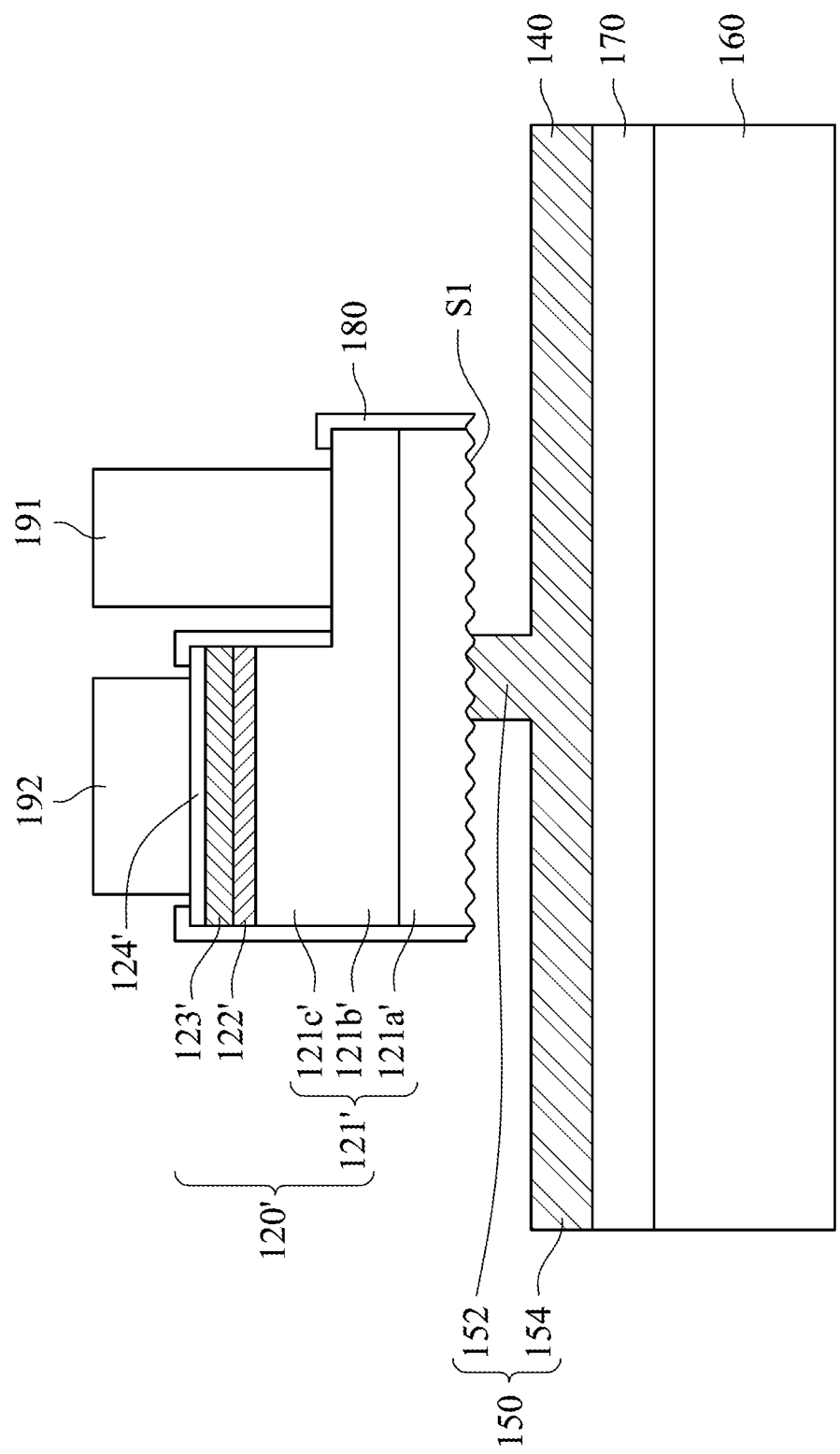

Reference is made to FIG. 8, after the semiconductor stack 120' is formed, the method continues to remove at least a portion of the sacrificial layer 140 in contact with the supporter 152 such that the semiconductor stack 120' is supported by the supporter 152 and separated from the sacrificial layer 140. In some embodiments, a portion of the sacrificial layer 140 is removed. In some embodiments, the sacrificial layer 140 may be removed by any suitable method such as using an etching solution. Specifically, after the sacrificial layer 140 is etched, a portion of the supporter 152 is exposed, and the light emitting diode structure 100 expected to be formed are suspended over the supporting layer 150 by the supporter 152. Since only the supporter 152 supports the upper structure after removing the sacrificial layer 140, the supporter 152 can be easily broken. In addition, in some embodiments, merely a portion of the sacrificial layer 140 is removed. That is, it is not necessary to remove the complete sacrificial layer 140 as long as the supporter 152 can be broken.

Next, the supporter 152 of the supporting layer 150 is broken to form the light emitting diode structure 100 shown in FIG. 1. The supporter 152 can be broken off by twisting or bending, but is not limited thereto. In some embodiments, when the supporter 152 is broken, a residual portion of the supporter 152 may remain on the light emitting diode structure 100, and the residual portion of the supporter 152 will not be cleaned off. In other embodiments, when the supporter 152 is broken, a residual portion of the supporter 152 may not remain on the light emitting diode structure 100. In other embodiments, in order to break the supporter 152, a portion of the insulation layer 180 on the light emitting diode structure 100 may be removed.

In some embodiments, the light emitting diode structure 100 is disposed on a transfer substrate (not shown) with an expected pattern. The light emitting diode structure 100 is then flipped and bonded to a die-bonding substrate (not shown) through the first conductive pad 191 and the second conductive pad 192. In some embodiments, the die-bonding substrate may be a rigid printed circuit board, an aluminum substrate with a high thermal conductivity coefficient, a ceramic substrate, a flexible printed circuit board, a metal-composite board, a light emitting substrate, or a semiconductor substrate with functional elements such as transistors and integrated circuits (ICs). It is noted that the processes and operations described above are illustrated for examples only, and each operation can be arbitrarily changed according to the requirements. In some embodiments, additional operations can be performed before, during or after the process above.

Figure 13:
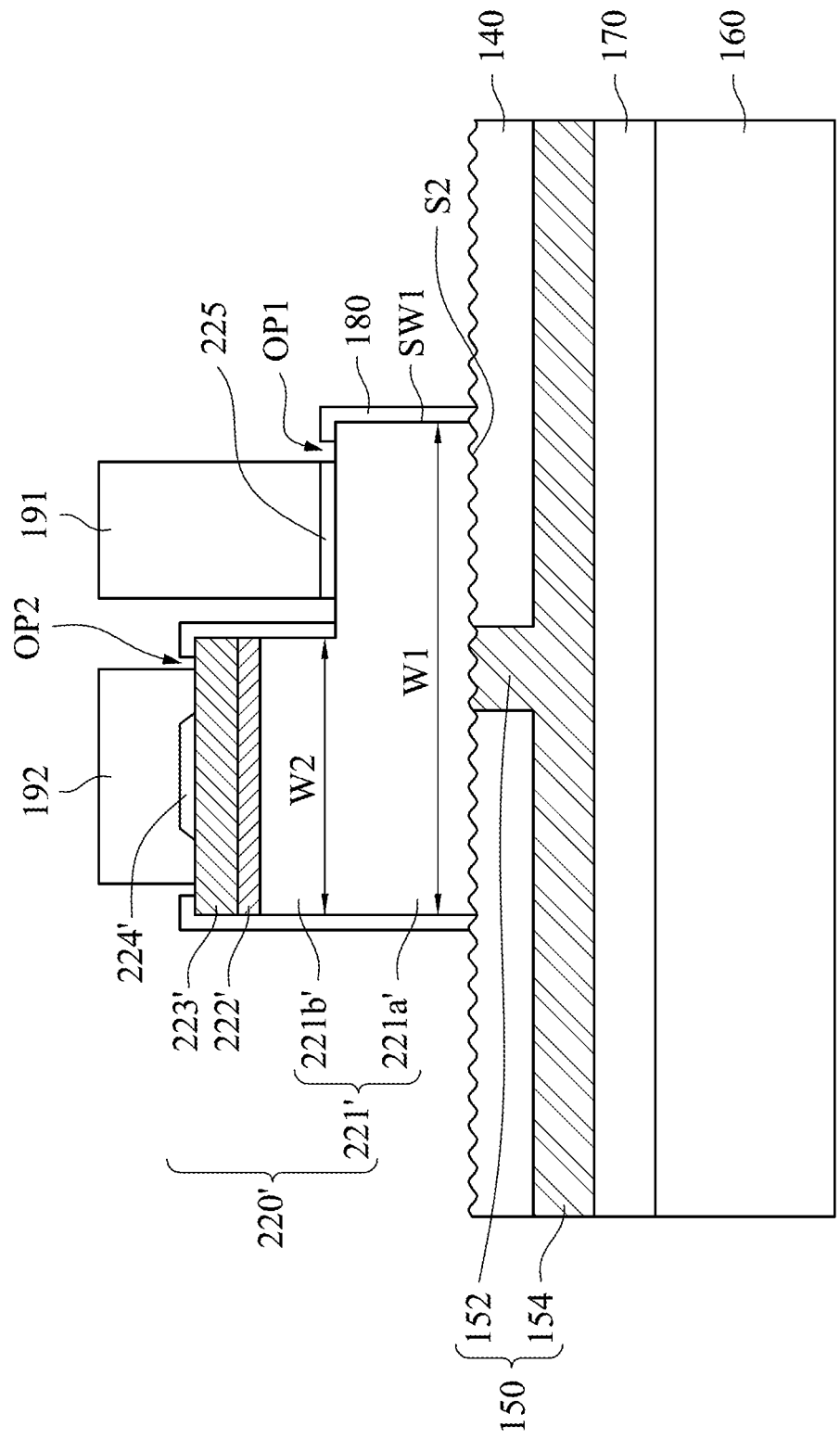
Figure 14:
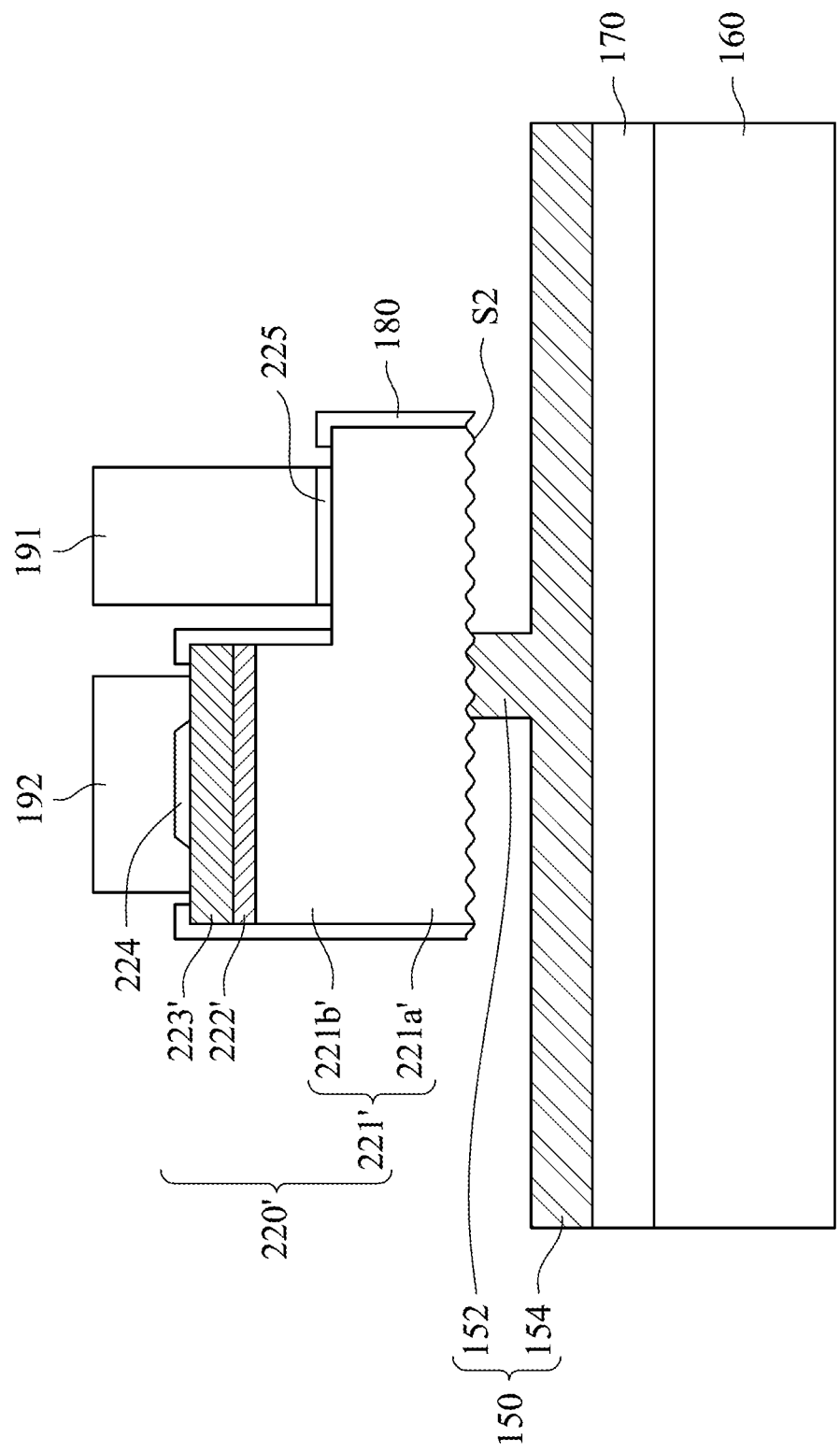
Figure 15:
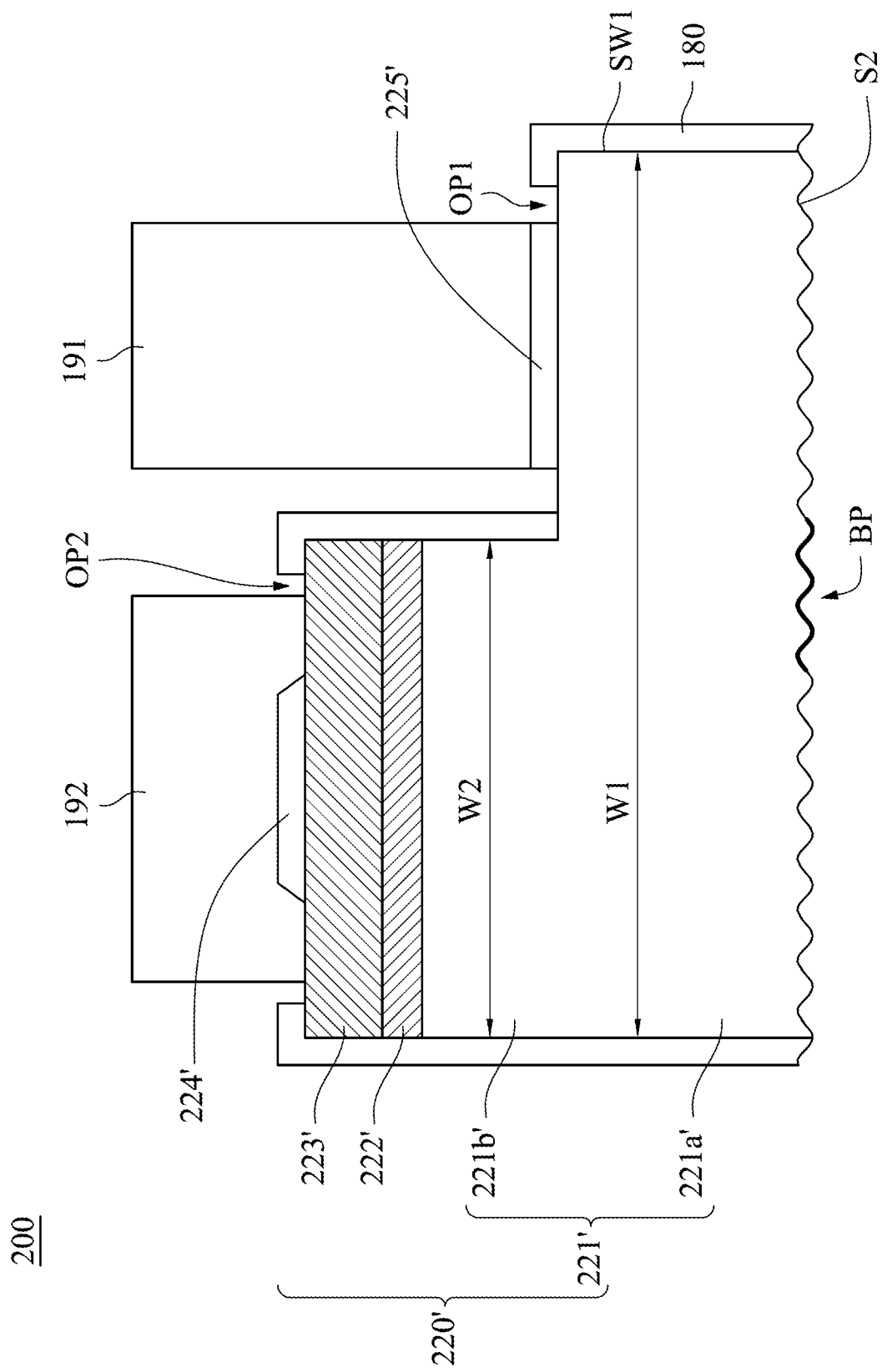

FIG. 9 to FIG. 15 are cross-sectional views illustrating various process stages of manufacturing the light emitting diode structure 200 shown in FIG. 15 in accordance with one embodiment of the present disclosure. It is understood that the light emitting diode structure 200 shown in FIG. 15 may be similar to or same as the light emitting diode structure 100 shown in FIG. 1. Specifically, the components in light emitting diode structure 200 may be the same as the components having same reference numbers of the aforementioned light emitting diode structure 100.

Figure 11:
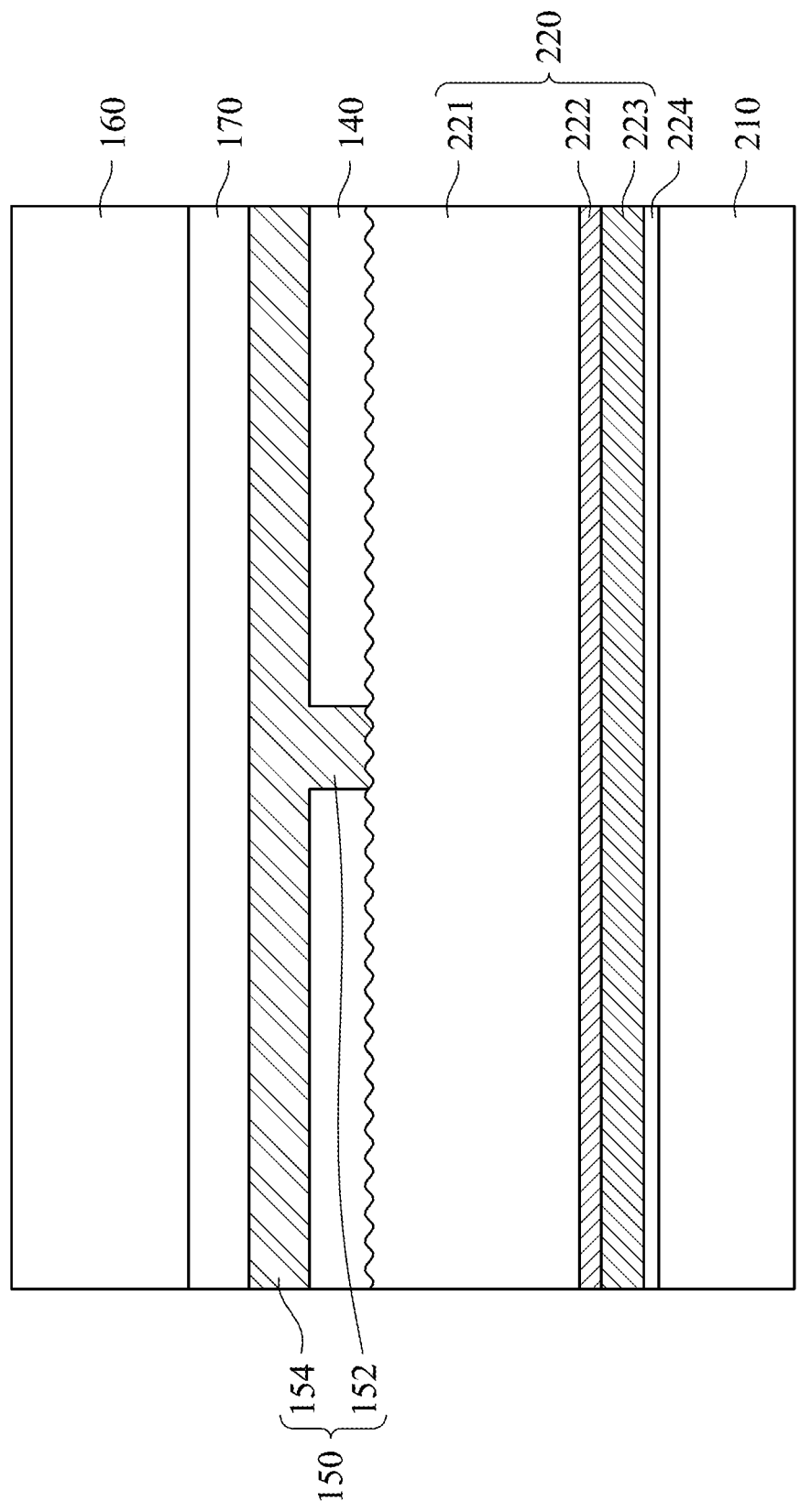
Figure 12:
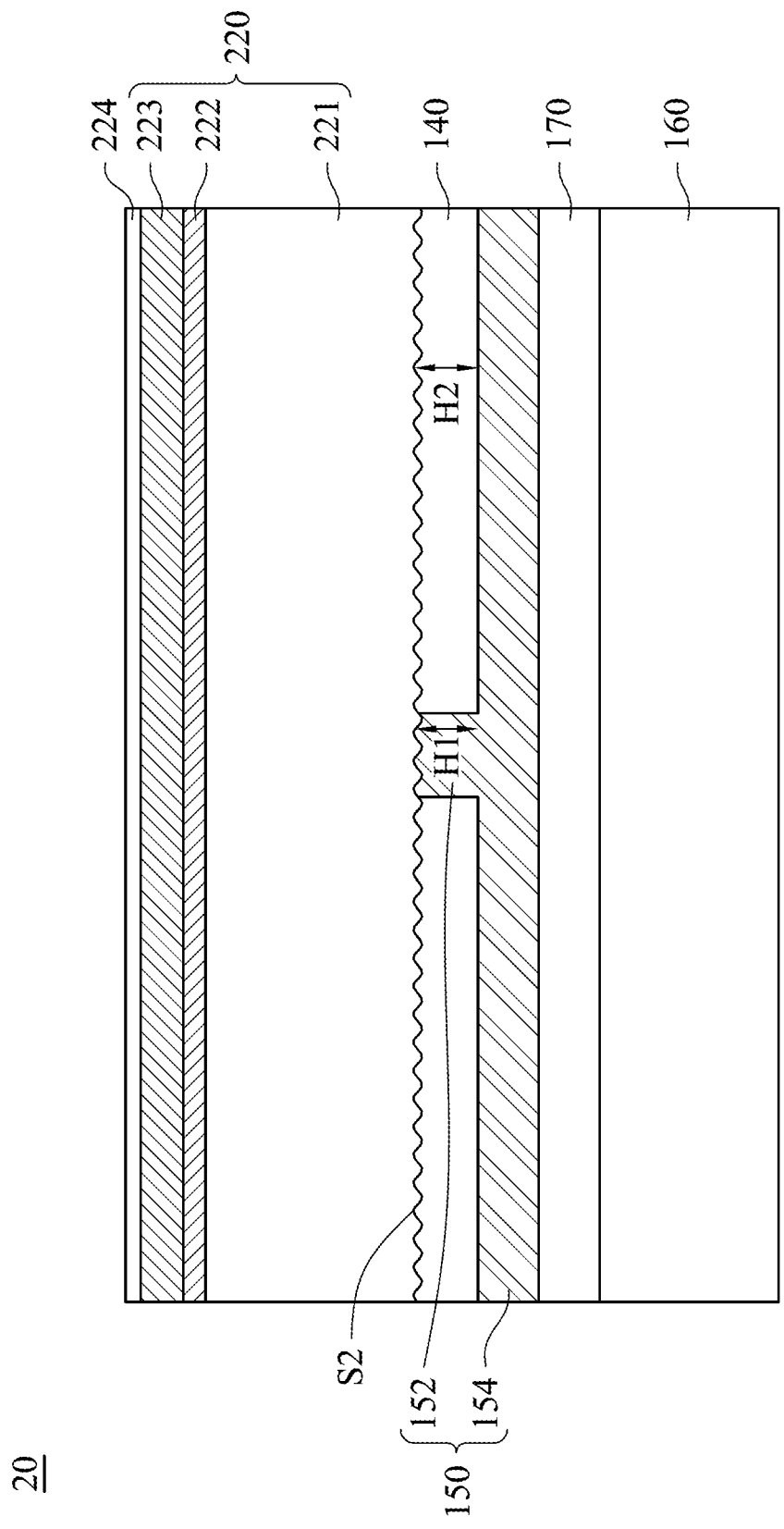

The method for manufacturing the light emitting diode structure 200 includes forming a precursor structure 20 (shown in FIG. 12). FIG. 9 to FIG. 12 are cross-sectional views illustrating various process stages of manufacturing the precursor structure 20 according to one embodiment of the present disclosure.

Figure 9:
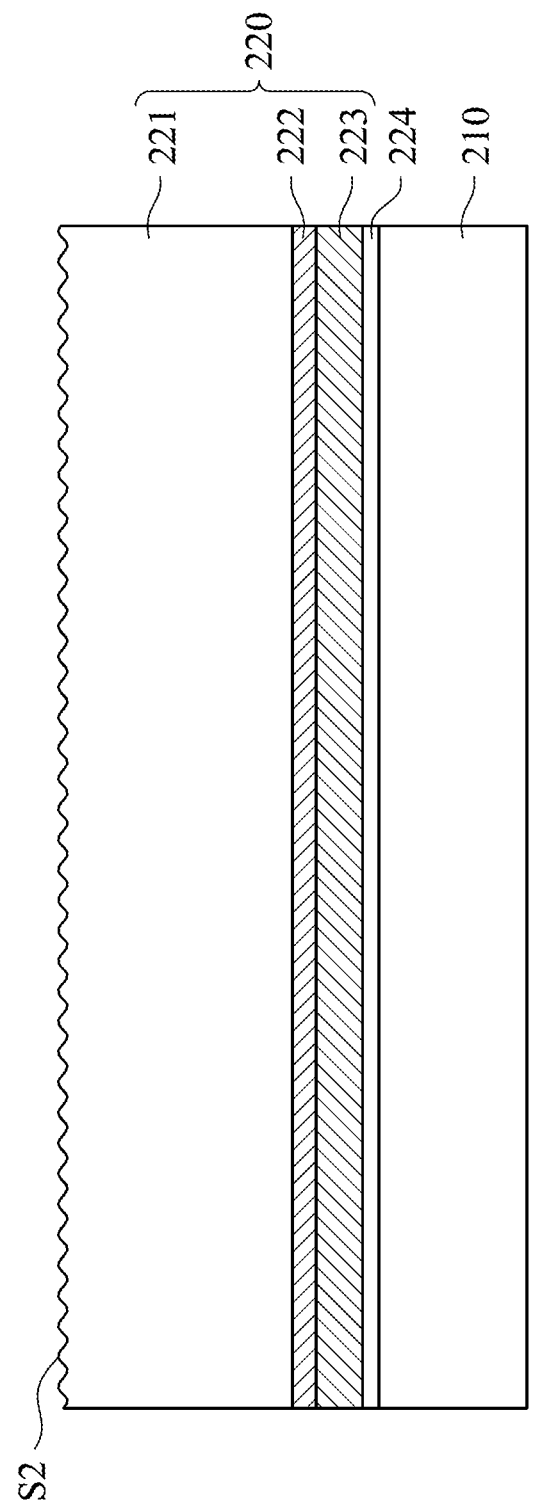
FIG. 9 to FIG. 15 are cross-sectional views illustrating various process stages of manufacturing a light emitting diode structure, in accordance with one embodiment of the present disclosure.

Please refer to FIG. 9, an epitaxial stack 220 is formed on a growth substrate 210, wherein the light emitting surface S2 is exposed outside. The light emitting surface S2 has a rough texture. Specifically, the epitaxial stack 220 includes a second semiconductor layer 223, a light emitting layer 222, and a first semiconductor layer 221 stacked in sequence on the growth substrate 210. In some embodiments, the growth substrate 210 may be GaAs substrate or other suitable substrates. The material of the first semiconductor layer 221, the light emitting layer 222, and the second semiconductor layer 223 may be respectively same as the first semiconductor layer 121', the light emitting layer 122', and the second semiconductor layer 123' of the light emitting diode structure 100 described above, and will not be repeated hereinafter. In some embodiments, a conductive layer 224 is further formed between the growth substrate 210 and the second semiconductor layer 223. In some examples, the conductive layer 224 may be N-type GaAs, but is not limited thereto.

Figure 10:
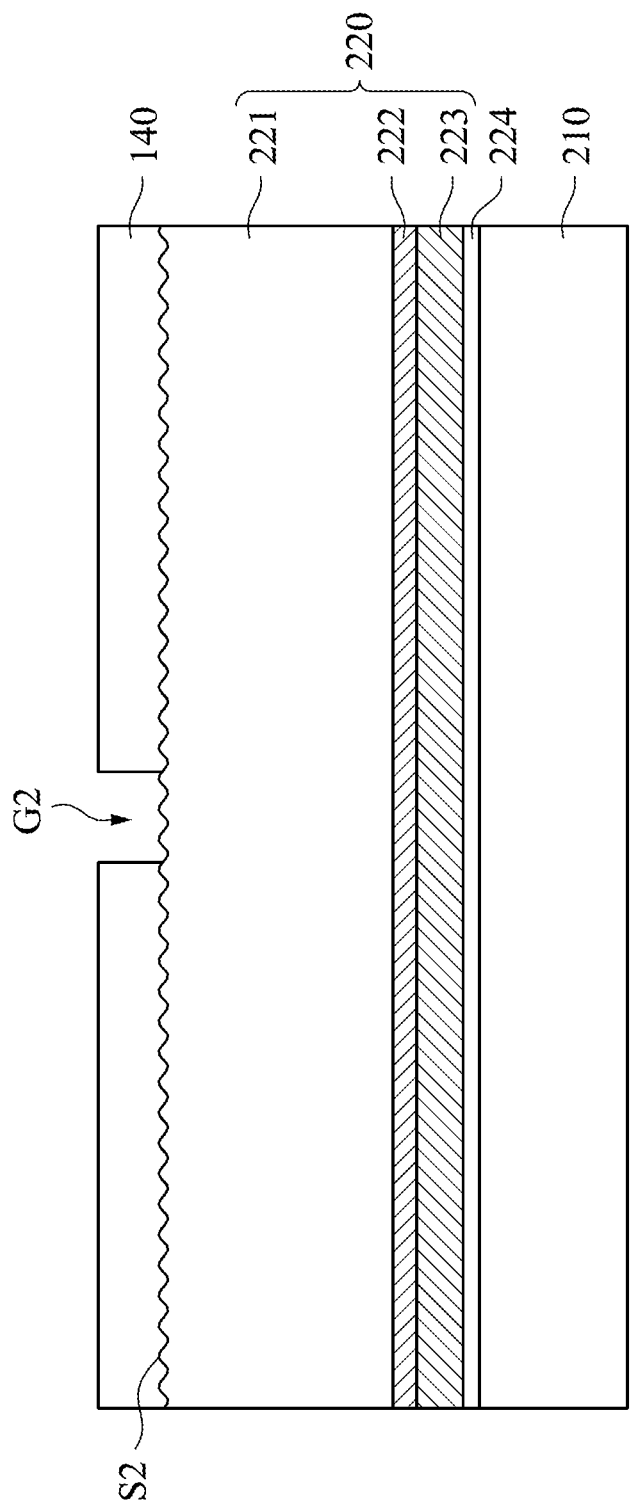

Please refer to FIG. 10, a sacrificial layer 140 is formed on the light emitting surface S2 of the epitaxial stack 220. The sacrificial layer 140 has a gap G2 exposing a portion of the light emitting surface S2. In some embodiments, the gap G2 has a width of about 0.5-10 μm. For example, the width of the gap G2 may be 0.6, 0.7, 0.8, 1, 2, 5, 8, or 9 μm. In some embodiments, the sacrificial layer 140 may include benzocyclobutene (BCB) or polyimide (PI), but is not limited thereto.

Referring to FIG. 11, a supporting layer 150 is formed on the sacrificial layer 140. The supporting layer 150 includes a supporter 152 and a base portion 154. Specifically, the supporter 152 is filled in the gap G2 and in contact with the light emitting surface S2 of the epitaxial stack 220. In some embodiments, the supporter 152 may be a cylinder or a polygon column. In some examples, supporter 152 has a width or a diameter of about 0.5-10 μm, for example, may be about 0.6, 0.7, 0.8, 1, 2, 5, 8, or 9 μm. In some embodiments, the supporting layer 150 may include insulating materials, metallic materials, or other supporting materials. For example, the insulating materials include silicon dioxide, silicon nitride, silicon oxynitride, and epoxy resin; and the metallic materials include aluminum, titanium, platinum, or nickel, but not limited thereto.

Still referring to FIG. 11, a carrier substrate 160 is formed over the sacrificial layer 140. In some embodiments, the carrier substrate 160 may be a sapphire substrate or other suitable substrates. In some embodiments, an adhesive layer 170 may be formed between the supporting layer 150 and the carrier substrate 160. The carrier substrate 160 can be adhered to the supporting layer 150 by the adhesive layer 170 to enhance the adhesion between the carrier substrate 160 and the supporting layer 150. In some embodiments, the adhesive layer 170 may include insulation glue, conductive glue and/or metals. In some examples, the materials of the adhesive layer 170 may be insulation glue such as an epoxy resin or a silicone, but not limited thereto. In some examples, the materials of the adhesive layer 170 may be conductive glue such as an epoxy resin mixed with silver powders, but not limited thereto. In some examples, the materials of the adhesive layer 170 may be a metal such as copper, aluminum, tin and/or zinc, but not limited thereto.

Referring to FIG. 12, the growth substrate 210 is removed. In some embodiments, the conductive layer 224 is omitted, and the epitaxial stack 220 is exposed after removing the growth substrate 210. It should be stated that after forming the carrier substrate 160 on the supporting layer 150, the structure shown in FIG. 11 is flipped upside down so that the growth substrate 210 is at the top and the carrier substrate 160 is at the bottom to remove the growth substrate 210. In some embodiments, the growth substrate 210 may be removed by laser lift-off (LLO), grinding, or etching.

As shown in FIG. 12, the precursor structure 20 is formed. The precursor structure 20 includes the carrier substrate 160, the supporting layer 150, the sacrificial layer 140, and the epitaxial stack 220. The supporting layer 150 is disposed on the carrier substrate 160, and the supporting layer 150 includes the base portion 154 and the supporter 152 protruded from the base portion 154. The sacrificial layer 140 is disposed on the base portion 154 of the supporting layer 150. The sacrificial layer 140 has a height H2 that is substantially equal to a height H1 of the supporter 152. The epitaxial stack 220 is on the sacrificial layer 140. The epitaxial stack 220 has a light emitting surface S2 in contact with the supporter 152 and the sacrificial layer 140, and the light emitting surface S2 has a rough texture. The adhesive layer 170 may be disposed between the supporting layer 150 and the carrier substrate 160.

Reference is made to FIG. 13, after the precursor structure 20 is formed, the method continues to remove a portion of the epitaxial stack 220 to form a semiconductor stack 220' and exposing a portion of the sacrificial layer 140. As shown in FIG. 13, the semiconductor stack 220' includes a first semiconductor layer 221', a light emitting layer 222', and a second semiconductor layer 223'. The first semiconductor layer 221' is in contact with the supporter 152. In some embodiments, the first semiconductor layer 221' includes a first portion (i.e., the semiconductor layer 221a') and a second portion (i.e., the semiconductor layer 221b') disposed on the first portion, and a width W1 of the first portion is greater than a width W2 of the second portion.

The light emitting layer 222' is disposed on the first semiconductor layer 221'. The second semiconductor layer 223' is disposed on the light emitting layer 222', wherein the second semiconductor layer 223' has a type that is different from the first semiconductor layer 221'. In some examples, the first semiconductor layer 221' may be P-type GaP, and the second semiconductor layer 223' may be N-type AlInGaP.

As shown in FIG. 13, in some embodiments, a portion of the conductive layer 224 is further removed during removing a portion of the epitaxial stack 220 to formed an first conductive contact layer 224' on the second semiconductor layer 223' of the semiconductor stack 220'. In other embodiments, the first conductive contact layer 224' can be omitted. In some embodiments, a second conductive contact layer 225 is formed on the first portion 221a' of the first semiconductor layer 221'.

After the formation of the semiconductor stack 220', the method may further include forming an insulation layer 180 covering at least a sidewall SW1 of the semiconductor stack 220'. The insulation layer 180 has a first opening OP1 and a second opening OP2 respectively exposed a portion of the first semiconductor layer 221' and a portion of the semiconductor layer 223' (or the first conductive contact layer 224'). In some embodiments, the insulation layer 180 may be formed by chemical vapor deposition, printing, coating, or other suitable methods.

Next, the method may further include forming a first conductive pad 191 and a second conductive pad 192 respectively in the first opening OP1 and the second opening OP2. Specifically, the first conductive pad 191 is electrically connected to the first semiconductor layer 221' through the first opening OP1, and the second conductive pad 192 is electrically connected to the second semiconductor layer 223' through the second opening OP2. In some embodiments, the first conductive pad 191 and the second conductive pad 192 can be formed by sputtering, evaporation, or electroplating. In some embodiments, the first conductive pad 191 and the second conductive pad 192 may include aluminum, copper, nickel, gold, platinum, titanium, or other suitable conductive materials.

Reference is made to FIG. 14, after the semiconductor stack 220' is formed, the method continues to remove at least a portion of the sacrificial layer 140 in contact with the supporter 152 such that the semiconductor stack 220' is supported by the supporter 152 and separated from the sacrificial layer 140. In some embodiments, the sacrificial layer 140 may be removed by any suitable method such as using an etching solution. Specifically, after the sacrificial layer 140 is etched, a portion of the supporter 152 is exposed, and the light emitting diode structure 200 expected to be formed are suspended over the supporting layer 150 by the supporter 152. Since only the supporter 152 supports the upper structure after removing the sacrificial layer 140, the supporter 152 can be easily broken. In addition, in some embodiments, merely a portion of the sacrificial layer 140 is removed. That is, it is not necessary to remove the complete sacrificial layer 140 as long as the supporter 152 can be broken.

Reference is made to FIG. 15, the supporter 152 of the supporting layer 150 is broken off to form the light emitting diode structure 200. In some embodiments, when the supporter 152 is broken, a residual portion of the supporter 152 may remain on the light emitting diode structure 200, and the residual portion of the supporter 152 will not be cleaned off. In other embodiments, when the supporter 152 is broken, a residual portion of the supporter 152 may not remain on the light emitting diode structure 200. In other embodiments, in order to break the supporter 152, a portion of the insulation layer 180 on the light emitting diode structure 200 may be removed.

In some embodiments, the light emitting diode structure 200 is disposed on a transfer substrate (not shown) with an expected pattern. The light emitting diode structure 200 is then flipped and bonded to a die-bonding substrate (not shown) through the first conductive pad 191 and the second conductive pad 192. In some embodiments, the die-bonding substrate may be a rigid printed circuit board, an aluminum substrate with a high thermal conductivity coefficient, a ceramic substrate, a flexible printed circuit board, a metal-composite board, a light emitting substrate, or a semiconductor substrate with functional elements such as transistors and integrated circuits (ICs).

It is noted that the processes and operations described above are illustrated for examples only, and each operation can be arbitrarily changed according to the requirements. In some embodiments, additional operations can be performed before, during or after the process above.

The light emitting diode structure and the manufacturing method thereof of the present disclosure can be applied not only to the conventional light emitting diode and the micro light emitting diode that the size is reduced to a level of micron meters (µm), but also can be widely applied to display devices and wearable devices. The light emitting diode structures described above may be a red, green, or blue light emitting diode.

As described above, the light emitting diode structure disclosed herein includes a semiconductor stack, and its light emitting surface has a rough texture. In the process of manufacturing the light emitting diode structure, a precursor structure having a supporting layer and a sacrificial layer supporting an epitaxial stack is formed. Subsequently, the epitaxial stack becomes the semiconductor stack with a supporter on the rough light emitting surface. The supporter can be easily broken off to form the individual light emitting diode structure. Conventional supporter is formed on a sidewall of a light emitting diode structure, such that it is necessary to keep some space between the adjacent light emitting diode structures for accommodating the supporter. In contrast, the supporter of the present disclosure is formed beneath the light emitting diode structure, which can increase the density of arrangement of the light emitting diode on a wafer. Further, by using the formation of the supporter, the transfer time can be reduced. The selected light emitting diode structures can be transferred to a transfer substrate having an expected pattern (e.g., pitch) same as a final substrate. The selected light emitting diode structure is then flipped and bonded to the final substrate at one time. A plurality of the selected light emitting diode structures can be bonded to the final substrate with only one transfer process, such that the process yield, the accuracy associated with the alignment and pitch spacing between the light emitting diodes can be improved significantly. Moreover, the repair cost can be reduced because of the light emitting diode is selected before being transferred.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims.

What is claimed is:

1. A light emitting diode structure, comprising:
   a semiconductor stack comprising:
      a first semiconductor layer, wherein the first semiconductor layer has a light emitting surface having a rough texture;
      a light emitting layer disposed on the first semiconductor layer; and
      a second semiconductor layer disposed on the light emitting layer, wherein the second semiconductor layer has a type that is different from the first semiconductor layer; and
   a supporting breakpoint on the light emitting surface, wherein the supporting breakpoint is overlapped with the semiconductor stack in a direction that the first semiconductor layer and the second semiconductor layer stacked.

2. The light emitting diode structure of claim 1, wherein the first semiconductor layer comprises a first portion and a second portion, the second portion is disposed on the first portion, and a width of the first portion is greater than a width of the second portion.

3. The light emitting diode structure of claim 1, wherein the first semiconductor layer comprises a doped semiconductor layer and an undoped semiconductor layer, the doped semiconductor layer is between the light emitting layer and the undoped semiconductor layer, and the light emitting surface is on the undoped semiconductor layer.

4. The light emitting diode structure of claim 1, further comprising an insulation layer covering a sidewall of the semiconductor stack.

5. The light emitting diode structure of claim 1, further comprising:
   a first conductive pad electrically connected to the first semiconductor layer; and
   a second conductive pad electrically connected to the second semiconductor layer.

6. A light emitting diode structure, comprising:
   a semiconductor stack comprising a first semiconductor layer, a light emitting layer, and a second semiconductor layer stacked in sequence, wherein the first semiconductor layer has a light emitting surface having a rough texture; and
   a supporter in contact with the light emitting surface, wherein the supporter is overlapped with the semiconductor stack in a direction that the first semiconductor layer and the second semiconductor layer stacked.

7. The light emitting diode structure of claim 6, wherein the supporter can be broken off.

8. The light emitting diode structure of claim 6, wherein the second semiconductor layer has a type that is different from the first semiconductor layer.

9. The light emitting diode structure of claim 6, wherein the first semiconductor layer comprises a first portion and a second portion, the second portion is disposed on the first portion, and a width of the first portion is greater than a width of the second portion.

10. The light emitting diode structure of claim 6, wherein the first semiconductor layer comprises a doped semiconductor layer and an undoped semiconductor layer, the doped semiconductor layer is between the light emitting layer and the undoped semiconductor layer, and the light emitting surface is on the undoped semiconductor layer.

11. The light emitting diode structure of claim 6, further comprising an insulation layer covering at least a sidewall of the semiconductor stack, wherein the insulation layer has a first opening and a second opening respectively located on the first semiconductor layer and the second semiconductor layer.

12. The light emitting diode structure of claim 11, further comprising:
   a first conductive pad electrically connected to the first semiconductor layer through the first opening; and
   a second conductive pad electrically connected to the second semiconductor layer through the second opening.

13. A method of manufacturing a light emitting diode structure, comprising:
   forming a precursor structure comprising:
      a carrier substrate;
      a supporting layer disposed on the carrier substrate, wherein the supporting layer has a base portion and a supporter protruded from the base portion, and the base portion and the supporter are made of same material;
      a sacrificial layer disposed on the base portion of the supporting layer, wherein the sacrificial layer has a height that is substantially equal to a height of the supporter; and
      an epitaxial stack on the sacrificial layer, wherein the epitaxial stack has a light emitting surface in contact with the supporter and the sacrificial layer, and the light emitting surface has a rough texture; and
   removing a portion of the epitaxial stack to form a semiconductor stack and exposing a portion of the sacrificial layer;

removing at least a portion of the sacrificial layer in contact with the supporter such that the semiconductor stack is supported by the supporter and separated from the sacrificial layer; and breaking the supporter of the supporting layer to form a light emitting diode structure.

14. The method of claim 13, wherein forming the precursor structure comprising:

forming the epitaxial stack on a growth substrate;

forming the sacrificial layer on the epitaxial stack, wherein the sacrificial layer has a gap exposing a portion of the light emitting surface;

forming the supporting layer on the sacrificial layer, wherein the supporter is filled in the gap and in contact with the epitaxial stack;

forming the carrier substrate over the sacrificial layer; and removing the growth substrate.

15. The method of claim 13, wherein forming the precursor structure comprising:

forming the epitaxial stack on a growth substrate, wherein the light emitting surface is in contact with the growth substrate;

forming a temporary substrate on the epitaxial stack;

removing the growth substrate to expose the light emitting surface;

forming the sacrificial layer on the light emitting surface of the epitaxial stack, wherein the sacrificial layer has a gap exposing a portion of the light emitting surface;

forming the supporting layer on the sacrificial layer, wherein the supporter is filled in the gap and in contact with the epitaxial stack;

forming the carrier substrate over the sacrificial layer; and removing the temporary substrate to expose the epitaxial stack.

16. The method of claim 13, wherein the precursor structure further comprises an adhesive layer between the supporting layer and the carrier substrate.

17. The method of claim 13, wherein the semiconductor stack comprises:

a first semiconductor layer in contact with the supporter, wherein the first semiconductor layer has a first portion and a second portion, the second portion is disposed on the first portion, and a width of the first portion is greater than a width of the second portion;

a light emitting layer disposed on the first semiconductor layer; and a second semiconductor layer disposed on the light emitting layer, wherein the second semiconductor layer has a type that is different from the first semiconductor layer.

18. The method of claim 17, wherein the first semiconductor layer comprises a doped semiconductor layer and an undoped semiconductor layer, the doped semiconductor layer is between the light emitting layer and the undoped semiconductor layer, and the light emitting surface is on the undoped semiconductor layer.

19. The method of claim 17, further comprising forming an insulation layer covering at least a sidewall of the semiconductor stack, wherein the insulation layer has a first opening and a second opening respectively exposing a portion of the first semiconductor layer and a portion of the second semiconductor layer.

20. The method of claim 19, further comprising forming a first conductive pad and a second conductive pad respectively in the first opening and the second opening.

* * * * *